(12) United States Patent
Chan et al.

(10) Patent No.: US 7,463,537 B2
(45) Date of Patent: Dec. 9, 2008

(54) GLOBAL BIT SELECT CIRCUIT INTERFACE WITH DUAL READ AND WRITE BIT LINE PAIRS

(75) Inventors: Yuen H. Chan, Poughkeepsie, NY (US); Ryan T. Freese, Poughkeepsie, NY (US); Antonio R. Pelella, Highland Falls, NY (US); Arthur D. Tuminaro, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/933,625

(22) Filed: Nov. 1, 2007

(65) Prior Publication Data

US 2008/0056052 A1 Mar. 6, 2008

Related U.S. Application Data

(63) Continuation of application No. 11/054,309, filed on Feb. 9, 2005, now Pat. No. 7,336,546.

(51) Int. Cl.
*G11C 7/00* (2006.01)

(52) U.S. Cl. ............... 365/190; 365/154; 365/205
(58) Field of Classification Search ............... 365/190, 365/154, 205
See application file for complete search history.

(56) References Cited

U.S. PATENT DOCUMENTS

| | | | |
|---|---|---|---|
| 5,615,160 | A | 3/1997 | Phillips et al. |
| 5,623,450 | A | 4/1997 | Phillips et al. |
| 5,706,237 | A | 1/1998 | Ciraula et al. |
| 5,729,501 | A | 3/1998 | Phillips et al. |
| 6,515,894 | B2 | 2/2003 | Osada et al. |
| 6,704,238 | B2 | 3/2004 | Izutsu et al. |
| 7,102,946 | B2 * | 9/2006 | Pelella ............... 365/205 |
| 7,113,433 | B2 * | 9/2006 | Chan et al. ............... 365/190 |

* cited by examiner

*Primary Examiner*—Huan Hoang
*Assistant Examiner*—Kretelia Graham
(74) *Attorney, Agent, or Firm*—Lynn L. Augspurger

(57) ABSTRACT

A domino SRAM global bit select circuit provides an interface between dual global read and write bit line pairs to a "local bit select" circuit.

1 Claim, 3 Drawing Sheets

GLOBAL BIT SELECT CIRCUIT INTERFACE WITH DUAL READ AND WRITE BIT LINE PAIRS

CROSS-REFERENCE TO RELATED APPLICATIONS

This application is a continuation of U.S. Ser. No. 11/054,309, filed Feb. 9, 2005, now U.S. Pat. No. 7,336,546, entitled "Global bit select circuit with dual read and write bit line pairs" by Yuen Chan and contains subject matter that is related to the subject matter of the following co-pending applications, each of which is assigned to the same assignee as this application, International Business Machines Corporation of Armonk, N.Y., and is filed concurrently herewith. Each of the below listed applications is hereby incorporated herein by reference.

High Speed Domino Bit Line Interface Early Read and Noise Suppression, U.S. patent application Ser. No. 11/054,296, Global Bit Select Circuit With Dual Read and Write Bit Line Pairs, U.S. patent application Ser. No. 11/054,309, Local Bit Select Circuit With Slow Read Recovery Scheme, U.S. patent application Ser. No. 11/054,148; Global Bit Line Restore Timing Scheme and Circuit, U.S. patent application Ser. No. 11/054,479; Local Bit Select With Suppression of Fast Read Before Write, U.S. patent application Ser. No. 11/054,402.

BACKGROUND OF THE INVENTION

1. Field of the Invention

This invention relates to a high performance domino Static Random Access Memory (SRAM) in which the core cells of the memory are segmented into sub-arrays accessed by local bit lines connected to global bit lines, and more particularly to an interface between dual read and write global bit line pairs and local bit line pairs.

2. Description of the Background

As will be appreciated by those skilled in the art, in a domino SRAM the individual cells do not employ sense amplifiers to sense the differential voltage on the bit line pairs coupled to the cross-coupled inverters that store the data. In a domino SRAM the local bit line is pre-charged, discharged, and the discharge is detected. The local bit line, the means to pre-charge it, and the detector define a dynamic node of the domino SRAM. The construction and operation of domino SRAMs are more fully explained in the prior art, including U.S. Pat. Nos. 5,729,501and 6,657,886, both assigned to the assignee of this application, and incorporated herein by reference. U.S. Pat. No. 6,058,065also assigned to the assignee of this application, and incorporated herein by reference, discloses a memory array in which the core cells are organized in sub-arrays accessed by local bit lines connected to global bit lines. The above referenced copending application entitled Local Bit Select With Suppression of Fast Read Before Write discloses a domino SRAM with one pair global bit lines for a read operation and another global pair bit lines for the write operation. An advantage of having two global bit line pairs is better overall performance in terms of faster reading from and writing to the memory cells. It is important that the interface from the global bit lines to the local bit line pairs does not detract from these performance gains.

BRIEF DESCRIPTION OF THE INVENTION

An object of this invention is the provision of an interface from dual global bit lines to local bit line pairs that does not place a performance burden on SRAM read/write function.

Another object of the invention is the provision of an interface that allows optimization of the write operation without adversely impacting the speed of the read operation.

A more specific object of the invention is the provision of a global to local dual bit line interface that provides low capacitance read and write bit lines, resulting in faster reading and writing.

Briefly, this invention contemplates the provision of a domino SRAM global bit select circuit to interface dual global read and write bit line pairs with to a "local bit select" circuit (or a group thereof).

BRIEF DESCRIPTION OF THE DRAWINGS

The subject matter that is regarded as the invention is particularly pointed out and distinctly claimed in the claims at the conclusion of the specification. The forgoing and other objects, features, and advantages of the invention are apparent from the following detailed description taken in conjunction with the accompanying drawings in which:

DETAILED DESCRIPTION OF THE INVENTION

Figure 1:
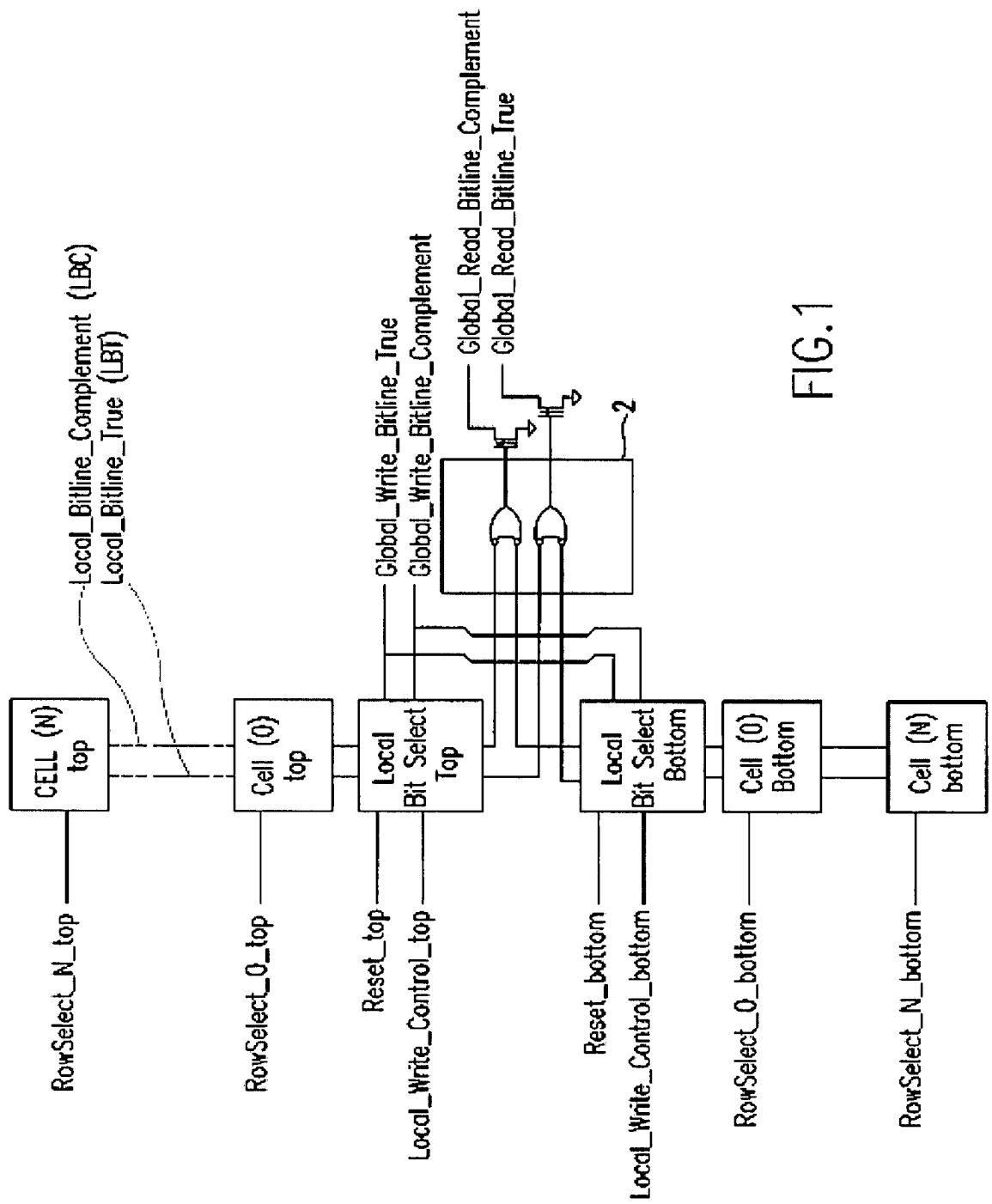
FIG. 1 is a block diagram of an N cell sub-array of a domino SRAM.

Referring to FIG. 1, it shows a domino SRAM "subarray" accessed by a Local Bit Select logic. This sub array has 0 through N cells labeled "top" and 0 through N cells labeled "bottom" with the top and bottom cells mirrored around a low active input "OR" function 2, with half the cells on one side and half on the other. The local bit lines are "OR'ed" together (i.e. the top local bit line complement (LBC) is "OR'ed" with the bottom LBC, and the top local bit line true (LBT) is "OR'ed" with the bottom LBT) to drive the "Wired OR" NFET, output which are connected to the complement and true global read bit lines. In standby state, the local bit lines are pre-charged to high level. In read mode, the active memory cell (from either the top or bottom sub array) pulls down on one of the local bit line. The active low bit line, through the OR gate, turns on the "wired OR" NFEET to pull down the global read bit line. Arranging the cells around a central point of the "OR" function 2, reduces the RC delay on the "local bit lines" because the distance to the furthest cell has been reduced by half. This improves both the write performance as well as the read access time of the sub array. The local bit select circuit, in addition to providing the read signal transfer, also provides the write control function. It has a set of global write bit lines (complement and true lines) as input. The write operation is controlled by the local write control line. Each local bit select circuit also performs the bit line pre-charge function (also known as bit line restore) at the end of an active read or write cycle. The local bit line's restore operation is triggered by the Reset" signal.

Figure 2:
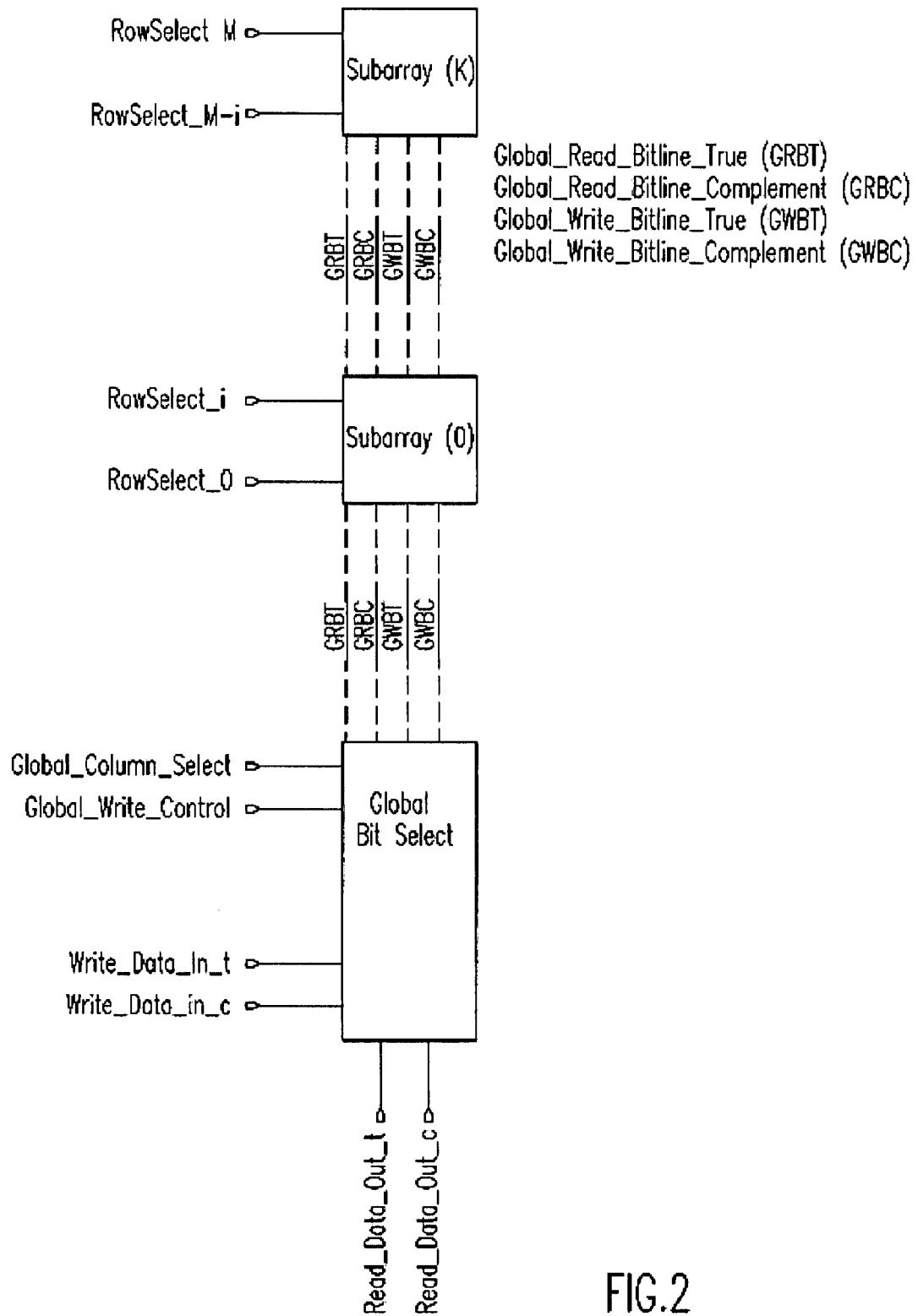
FIG. 2 is a one bit by M bit array of a domino SRAM where K sub-arrays (each containing i cells along the local bit lines) are connected to one global bit select circuit.

FIG. 2 is a one bit by M bit array of a domino SRAM where K sub-arrays (each containing i cells along the local bit lines) are connected to one global bit select circuit.

Figure 3:
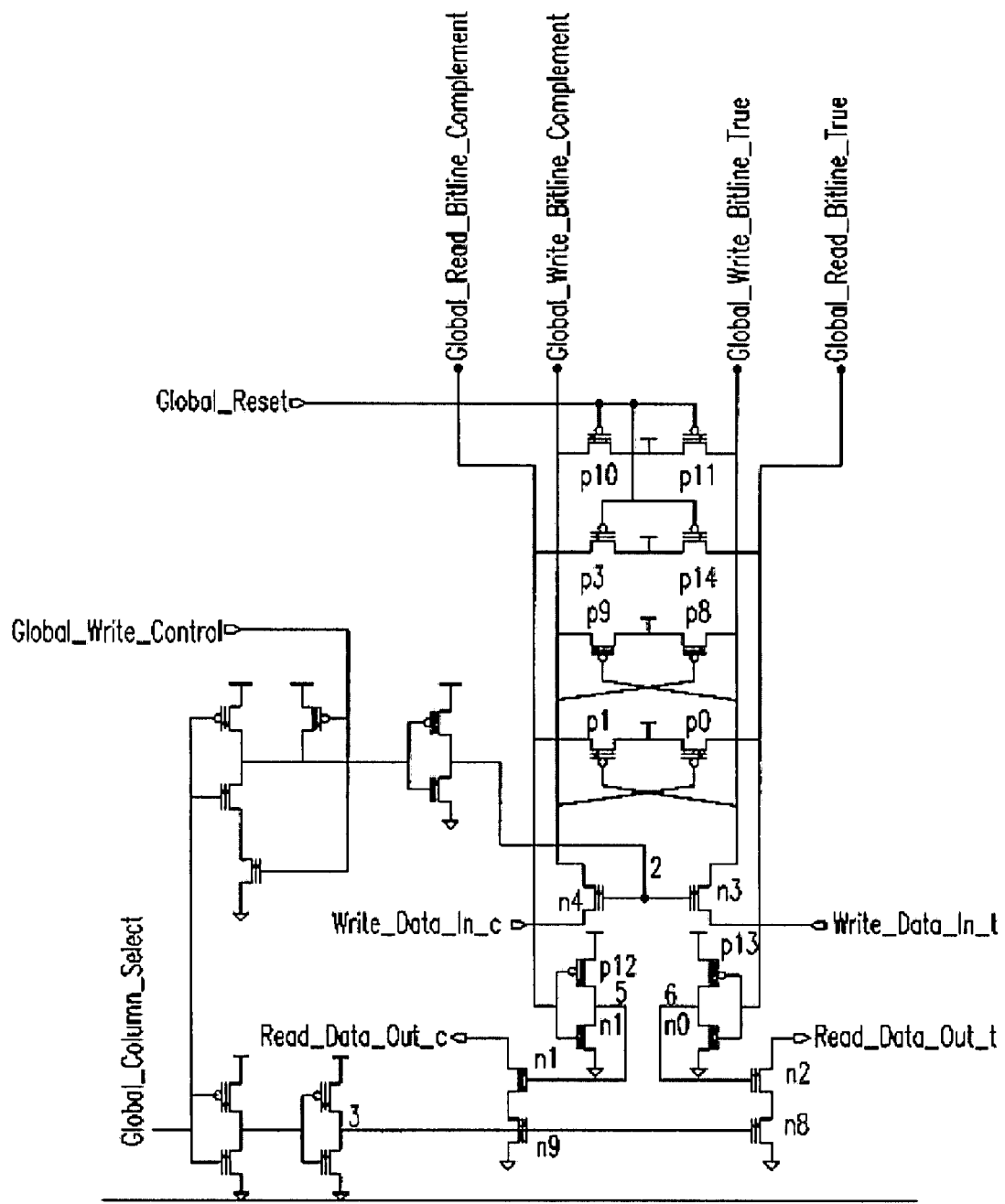
FIG. 3 is a schematic diagram of one embodiment of a domino SRAM global to local bit select circuit in accordance with the teachings of this invention.

The global bit line circuit shown in FIG. 3 has a global read bit line pair (Global-Read-Bit line-Complement or GRBC, and Global-Read-Bit line-True or GRBT) for input, and a global write bit line pair (Global-Write-Bit line-Complement or GWBC, and Global-Write-Bit line-True or GWBT) for output. These two global bit line pairs are connected to the local bit select circuits along the bit column. It also has a pair of write data bus (Write-Data-In-c/Write-Data-In-t) and a pair of read data output bus (Read-Data-Out-t/Read-Data-Out-c). Column select signals come in as the Global-Column-Select and Global-Write-Control. The Global-Column-Select, as the name suggests, selects the bit column for a read or a write operation. The Global-Write-Control enables the column for a write operation. Restore (pre-charge) of the global read and write bit line pairs are provided by the Global-Reset signal.

Referring to FIG. 3, the Global-Reset input is an active low signal (ie, restore when low, high during standby and read/write operations). PFET transistors P10/P11 restore the global write bit lines and P3/P14 restore the global read bit lines. Two pairs of cross-coupled "keep-quiet" PFET transistors (P0/P1 and P8/P9) are connected to the global read and write bit lines respectively. When one side of the bit lines is pulled low during read or write, the corresponding PFET is turned on to hold the opposite side of the bit line high (that is, keeping it in a quiet up level). These cross-coupled "keep-quiet" PFETs are necessary in order to maintain glitch-free (noise-free) read and write operations.

The Global-Column-Select input (coming from the bit decode circuitry, not shown here) selects the bit column for both the read and write operation. It is an active high signal. The global-Write-Control input (also an active high signal) controls the write data bus during a write operation. In standby mode, both the Global-Column-Select and the Global-Write-Control signals are off, the Global-Reset signal is on (low active) to pre-charge the global read and write bit lines high. In standby mode, the cross-coupled "keep-quiet" PFETs are OFF. The Read-Data-Out bus (t and c) are pre-charged high (by data-output reset circuitry, not shown).

In read mode, the Global-Reset signal is first switched high, turning off the pre-charge PFETs. The Global-Column-Select input is then activated while the Global-Write-Control input is kept low (low for reading and high for writing). Node 2 of the circuit is kept low to shut off the writing NFETs N3/N4. Node 3 is switched high to turn on the read port NFETs N8/N9. During read mode, one of the global read bit lines is pulled down by the active local bit select. For example, when a "1" is read from the memory cell, the Global-Read-Bit line-Complement is pulled low by the local bit select output. This down-going read signal is amplified by the inverter P12/N1 to pull up on node 5. As a result, the Read-Data-Out-c is switched low by the N9/N11 stack. When a "1" is read, the Global-Read-Bit line-True stays in a high level, node 6 is pulled down by the inverter N0/P13, turning off the N8/N12 stack. Read-Data-Out-t is thus not being pulled down and stays high from the previous pre-charge state.

In a write mode, the Global-Reset is first switched off (as in read mode), the Write-Data-In bus (c and t) are activated (one side is pulled low while the other side stays high). The Global-Column-Select and the Global-Write-Control inputs are both turn ON, driving node 2 and node 3 of FIG. 5 high. The writing NFETs N3/N4 are turned ON. For writing a "0", for example, the Write-Data-In-t signal is held low, pulling down the Global-Write-Bit line-True through N3. The Write-Data-In_c is held high, allowing the Global-Write-Bit line-C to stay high. This state of the Global-Write-Bit lines are passed to the local bit select circuit, which in turn writes a "0" into the selected memory cell. While node 2 is turned on to pass the write data onto the global write bit lines, node 3 is also switched high to turn on the read port (N8/N9). The write-thru data, which is passing thru from the local bit select circuit to the global read bit lines, is therefore also available on the read-data-out bus.

The invention claimed is:

1. A global to local dual bit line interface comprising in combination:
   a domino SRAM having a plurality of core memory cells in said domino SRAM organized in columns and rows with each of said columns comprised of a plurality of sub arrays of core memory cells, each of said sub arrays accessed by a local bit select logic;
   core memory cells in each sub array organized into a top group and a bottom group of core memory cells with half of the core memory cells in each sub array in the top group and half in the bottom group, with a local bit read line connected to said top group and a local bit read line connected to said bottom group;
   said local bit read line connected to said top group connected to one input of an OR gate and said local bit read line connected to said bottom group connected to another input of said OR gate;
   said OR gate located between said top group of core memory cells and said bottom group of core memory cells so that a core memory cell closest to said OR gate in said top group is the same distance from said OR gate as said core memory cell closest to said OR gate in said bottom group, the next closest in the top group is the same distance as the next closest in the bottom, and so on for all the core memory cells in the sub array; and
   wherein a domino bit select logic for said domino SRAM provides an interface between dual global read and write bit line pairs to said local bit select logic and between dual read and write global bit line pairs and local bit line pairs.

* * * * *